(12) United States Patent
Dong et al.

(10) Patent No.: US 8,918,296 B2
(45) Date of Patent: Dec. 23, 2014

(54) METHOD FOR DETECTING SINGLE PHASE GROUNDING FAULT BASED ON HARMONIC COMPONENT OF RESIDUAL CURRENT

(75) Inventors: Xinzhou Dong, Beijing (CN); Tao Cui, Beijing (CN)

(73) Assignees: Tsinghua University, Beijing (CN); Alstom Grid UK Limited, Stafford (GB)

( * ) Notice: Subject to any disclaimer, the term of this patent is extended or adjusted under 35 U.S.C. 154(b) by 910 days.

(21) Appl. No.: 13/126,139

(22) PCT Filed: Oct. 26, 2009

(86) PCT No.: PCT/CN2009/074606
§ 371 (c)(1),
(2), (4) Date: Apr. 26, 2011

(87) PCT Pub. No.: WO2010/048867
PCT Pub. Date: May 6, 2010

(65) Prior Publication Data
US 2011/0208449 A1    Aug. 25, 2011

(30) Foreign Application Priority Data
Oct. 27, 2008  (CN) .......................... 2008 1 0225056

(51) Int. Cl.
*G01R 31/00* (2006.01)
*G01R 31/02* (2006.01)
*H02H 3/32* (2006.01)
*H02H 1/00* (2006.01)

(52) U.S. Cl.
CPC ............ *G01R 31/025* (2013.01); *H02H 1/0092* (2013.01); *H02H 3/32* (2013.01)
USPC ......................................................... 702/58

(58) Field of Classification Search
CPC ...... G01R 23/00; G01R 23/16; G01R 31/025; G01R 31/343; H02H 1/0015
See application file for complete search history.

(56) References Cited

U.S. PATENT DOCUMENTS

| 5,578,931 A | 11/1996 | Russell et al. |
| 5,659,453 A | 8/1997 | Russell et al. |
| 7,345,488 B2 * | 3/2008 | Fischer .......................... 324/521 |

FOREIGN PATENT DOCUMENTS

| CA | 1 287 884 C | 8/1991 |
| CN | 1309300 | 8/2001 |

(Continued)

OTHER PUBLICATIONS

Zhang et al. "Single-Phase-to-Ground Fault Feeder Detection Based on Transient Current and Wavelet Packet," Nov. 2004, IEEE Publication, pp. 936-940.*
International Search Report in International Application No. PCT/CN2009/074606, mailed Jan. 28, 2010.

(Continued)

*Primary Examiner* — Elias Desta
(74) *Attorney, Agent, or Firm* — Nixon Peabody LLP

(57) ABSTRACT

The method for detecting single-phase grounding fault based on the harmonic component of residual current is provided, in which collecting and calculating the phase differences of third harmonic waves relative to the fundamental wave of the residual current in the feeder line, and judging if the phase differences of the residual current in the feeder line is into a threshold range, and judging if there is a suspected grounding fault, and confirming the fault event by judging the duration and the generated times of the suspected grounding fault. Another method for detecting single-phase grounding fault based on the harmonic component of residual current is provided, in which the residual current of neutral point is used.

8 Claims, 2 Drawing Sheets

(56) References Cited

FOREIGN PATENT DOCUMENTS

| CN | 1397807 | 2/2003 |
|---|---|---|
| CN | 101022216 | 8/2007 |
| CN | 101261304 | 9/2008 |
| CN | 101387682 | 3/2009 |
| JP | 9-145759 A | 6/1997 |
| JP | 2001-320828 | 11/2001 |
| RU | 2160953 | 12/2000 |
| RU | 2248583 | 3/2005 |

OTHER PUBLICATIONS

Emanuel, A.E. et al., "High Impedance Fault Arcing On Sandy Soil in 15kV Distribution Feeders: Contributions To The Evaluation Of The Low Frequency Spectrum", IEEE Transactions On Power Delivery, vol. 5, No. 2, pp. 676-686, Apr. 1990.

Ahmad, H. et al. "Harmonic components of leakage current as a diagnostic tool to study the aging of insulators", Journal of Electrostatics, vol. 66, Issues 3-4, pp. 156-164, Mar. 2008.

Extended European Search Report in European Application No. 09823059.2, dated Jun. 10, 2014.

\* cited by examiner

METHOD FOR DETECTING SINGLE PHASE GROUNDING FAULT BASED ON HARMONIC COMPONENT OF RESIDUAL CURRENT

CROSS REFERENCE TO RELATED APPLICATIONS OR PRIORITY CLAIM

This application is a national phase of International Application No. PCT/CN2009/074606, entitled "METHOD FOR DETECTING SINGLE PHASE GROUNDING FAULT BASED ON HARMONIC COMPONENT OF RESIDUAL CURRENT", which was filed on Oct. 26, 2009, and which claims priority of Chinese Patent Application No. 200810225056.1, filed Oct. 27, 2008.

DESCRIPTION

1. Field of the Invention

The present invention relates to power system protection and control, more particularly, to line selection when medium voltage (10 kV~66 kV) distribution line having radial connection and neutral resistance grounding occurs single phase grounding fault.

2. Background of the Invention

Single phase grounding fault is one of the most common faults in a distribution system. 6 kV-66 kV distribution network often makes the neutral point of the transformer ungrounded, or grounding via resistors or via an arc-extinguishing coil. The fault component of the residual current in an outgoing line is usually equivalent to grounding fault current in a distribution system with its single supply three-phase radially connected. In a conventional method for detecting grounding fault, the grounding fault can be detected just by measuring the residual current and comparing it with a threshold value. With the line expansion, however, the distributed capacitance in a sound line may form a circuit for the residual current. Consequently, the fault current caused by the fault line also flows through the circuit constituting of the sound line capacitance to ground, resulting that the detecting and protecting device in the sound line has an error detection of grounding fault because of the residual current increase. Therefore, it is necessary to use a direction distinguishing method to ensure the selectivity of the fault detection.

The traditional direction distinguishing method needs two kinds of information, i.e. voltage and current, and determines whether the fault occurs in the line according to the comparison of the voltage vector and current vector. The rendered problem is that protecting or detecting device needs to measure simultaneously the voltage and the current on the primary side of the system. Nevertheless, on one hand, the voltage signal is not available between the outgoing lines of some real systems, and thus only a simple over current is applied to detect the grounding fault. On the other hand, a detecting system will increase in its cost and complexity if introducing the voltage signal transformed from a voltage transformer.

Another problem in detecting the grounding fault is to detect the single phase grounding fault in the system with the transformer neutral point grounding via high-impedance resistors. Because of the high impedance of the fault circuit in the system with the neutral point grounding via high-impedance resistors, the fault current is limited below the operation threshold of the traditional over-current protection. It would be infeasible to detect the fault just with the amplitude. So, there have been many new methods based on the other signal characteristics, including a method using the harmonic component information. A. E. Emanuel pointed out the harmonic component typical of the grounding fault, comprising the second and third harmonic components, in his paper, 'High impedance fault arcing on sandy soil in 15 kV distribution feeders: contributions to the evaluation of the low frequency spectrum'. And it has been proved in the experiment that the second and third harmonic components will maintain a stable difference relative to the phase of the system voltage, when the stable grounding fault occurs. In 1990, D. I. Jeerings proposed a high-impedance fault detecting device 'HIFAS' based on the harmonic component information, which detected and judged the fault according to the phase change of the third harmonic component relative to the system voltage. The method used the third harmonic component as the characteristics of the high impedance grounding fault, followed by many derivative methods which were based on ideas about such low-frequency harmonic components. Researchers from Texas A & M University (TAMU), represented by D. B. Russell, began to study how to detect the high-impedance grounding fault in 1970, and proposed many methods recorded in the U.S. patents, including U.S. Pat. No. 5,578,931 about the method based on spectral analysis, and U.S. Pat. No. 5,659,453 about the method based on the comparison of the harmonic current and fundamental voltage. Harmonic component can be taken as the main component resulting in the change of the current waveform, and therefore it can reflect the current waveform distortion caused by the specificity of the grounding fault (such as arc's zero-crossing off in every cyclic wave and non-linear grounding resistance, etc.). Harmonics component detection does not simply use the amplitude information of the current, but reflects the high impedance fault more effectively. However, these high impedance detection methods still need both the voltage signal and the current signal. So they are not substitute for simple over-current protection.

SUMMARY OF THE INVENTION

The object of the present invention is to overcome the disadvantages of the existing technologies, and propose a method for detecting single phase grounding fault based on the harmonic component of the residual current. The invention analyses and compares the harmonic component and the fundamental component to distinguish the fault line and the non-fault line. The method can detect the fault direction and select the fault line only with the current information.

The invention, according to an embodiment as illustrated in FIG. 1, provides a method for detecting single phase grounding fault based on harmonic component of residual current, characterized in that, the method comprises the steps of:

1) continuously sampling and calculating the current in the feeder line, and getting the sample value sequence of the residual current in the feeder line (100);

2) averaging the sample value sequences of N cyclic waves prior to the present residual current in the feeder line, to get the average sample value sequence, wherein N is a positive integer (102);

3) getting the fault increment sequence by the present sample value sequence of one cyclic wave minus the average sample value sequence (104);

4) calculating the third harmonic amplitude and phase and the fundamental amplitude and phase of the fault increment sequence with Fourier transform, and getting the phase difference of the residual current in the feeder line by the third harmonic phase minus the fundamental phase (106);

5) if the phase difference of the residual current in the feeder line enters into the predetermined threshold range 1, determining that said feeder line occurs the suspected grounding fault (108);

6) judging the duration and the occurrence of the suspected grounding fault, to identify the fault event as: grounding fault, intermittent grounding fault, transient events or noise (110).

Determining the above threshold range 1 is that, through analysis, the phase difference of the third harmonic component relative to the fundamental component in the fault line is 180 degrees, and that of the third harmonic component relative to the fundamental component in the non-fault line is 0 degree, in the practical engineering applications, taking into account measurement and calculation error, the threshold range 1 should be set to an interval around 180 degrees. For example, the threshold range 1 can be set to 180 degrees±60 degrees.

Judging the duration and the occurrence of the suspected grounding fault is that, if the duration of the suspected grounding fault exceeds the fault time threshold, then we consider the grounding fault occurs, and that if the duration of the suspected grounding fault exceeds the transient event time threshold, then we consider the transient event occurs, and that if a plurality of transient events occur within the predetermined global reset time, then we consider the intermittent grounding fault occurs.

The fault time threshold, the transient event time threshold, the global reset time and the occurrence of the transient event can be set according to the analysis of the actual situation or according to the engineering experience. For example, the fault time threshold is set as 2-5 seconds, the transient event time threshold is set as 100-300 milliseconds, the global reset time is set as 20-40 seconds, and the occurrence of the transient event is set as 3-10 times.

The invention, according to an embodiment as illustrated in FIG. 2, also provides another method for detecting single phase grounding fault based on harmonic component of residual current, characterized in that, the method comprises the steps of:

1) continuously sampling and calculating the current in the feeder line and the current at the neutral point, and getting the sample value sequence of the neutral point residual current and the sample value sequence of the residual current in the feeder line (200);

2) averaging the sample value sequences of N cyclic waves prior to the present neutral point residual current and the sample value sequences of N cyclic waves prior to the present residual current in the feeder line respectively, to get the average sample value sequence of the neutral point residual current and the average sample value sequence of the residual current in the feeder line, wherein N is a positive integer (202);

3) getting the fault increment sequence of the neutral point residual current and the fault increment sequence of the residual current in the feeder line by the present sample value sequence of one cyclic wave of the neutral point residual current and the present sample value sequence of one cyclic wave of the residual current in the feeder line minus the above average sample value sequence respectively (204);

4) calculating the third harmonic amplitude and phase and the fundamental amplitude and phase of the fault increment sequence of the neutral point residual current and the third harmonic amplitude and phase and the fundamental amplitude and phase of the fault increment sequence of the residual current in the feeder line with Fourier transform, and getting the phase difference of the neutral point residual current and the phase difference of the residual current in the feeder line by the third harmonic phase minus the fundamental phase (206);

5) if the result of the phase difference of the neutral point residual current minus the phase difference of the residual current in the feeder line enters into the predetermined threshold range 2, determining that said feeder line occurs the suspected grounding fault (208);

6) judging the duration and the occurrence of the suspected grounding fault (210), to identify the fault event as: grounding fault, intermittent grounding fault, transient events or noise.

Determining the above threshold range 2 is that, the phase difference of the third harmonic component relative to the fundamental component of the residual current in the feeder line is $\phi_F$, and that of the third harmonic component relative to the fundamental component of the residual current at the neutral point is $\phi_{RN}$, through analysis, $\phi_F$ and $\phi_{RN}$ have the same phase in the fault line, and $\phi_F$ and $\phi_{RN}$ have the opposite phase in the non-fault line. In the practical engineering applications, taking into account measurement and calculation error, the threshold range 2 should be set to the neighboring region of 0 degree. For example, the threshold range 2 can be set to ±60 degrees.

Judging the duration and the occurrence of the suspected grounding fault is that, if the duration of the suspected grounding fault exceeds the fault time threshold, then we consider the grounding fault occurs, and that if the duration of the suspected grounding fault exceeds the transient event time threshold, then we consider the transient event occurs, and that if a plurality of transient events occur within the predetermined global reset time, then we consider the intermittent grounding fault occurs.

The fault time threshold, the transient event time threshold, the global reset time and the occurrence of the transient event can be set according to the analysis of the actual situation or the engineering experience. For example, the fault time threshold is set as 2-5 seconds, the transient event time threshold is set as 100-300 milliseconds, the global reset time is set as 20-40 seconds, and the occurrence of the transient event is set as 3-10 times.

BRIEF DESCRIPTION OF THE DRAWINGS

Embodiments of the present invention are illustrated by way of example and not limitation in the figures of the accompanying drawings, in which like references indicate similar elements and in which.

THE FEATURES AND EFFECTS OF THE INVENTION

Figure 1:
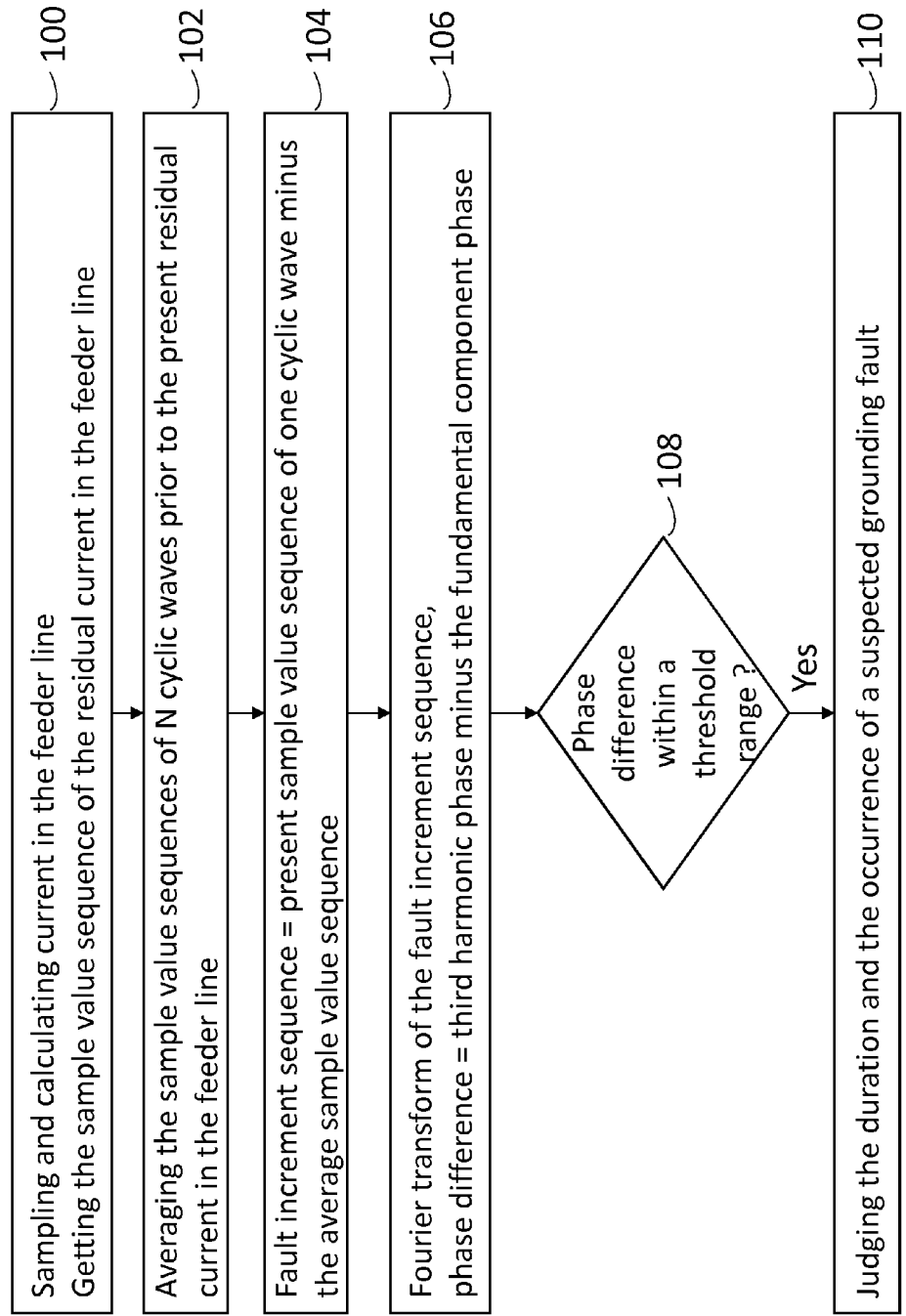
FIG. 1 illustrates a flow diagram of a method for detecting a grounding fault according to an embodiment.
Figure 2:
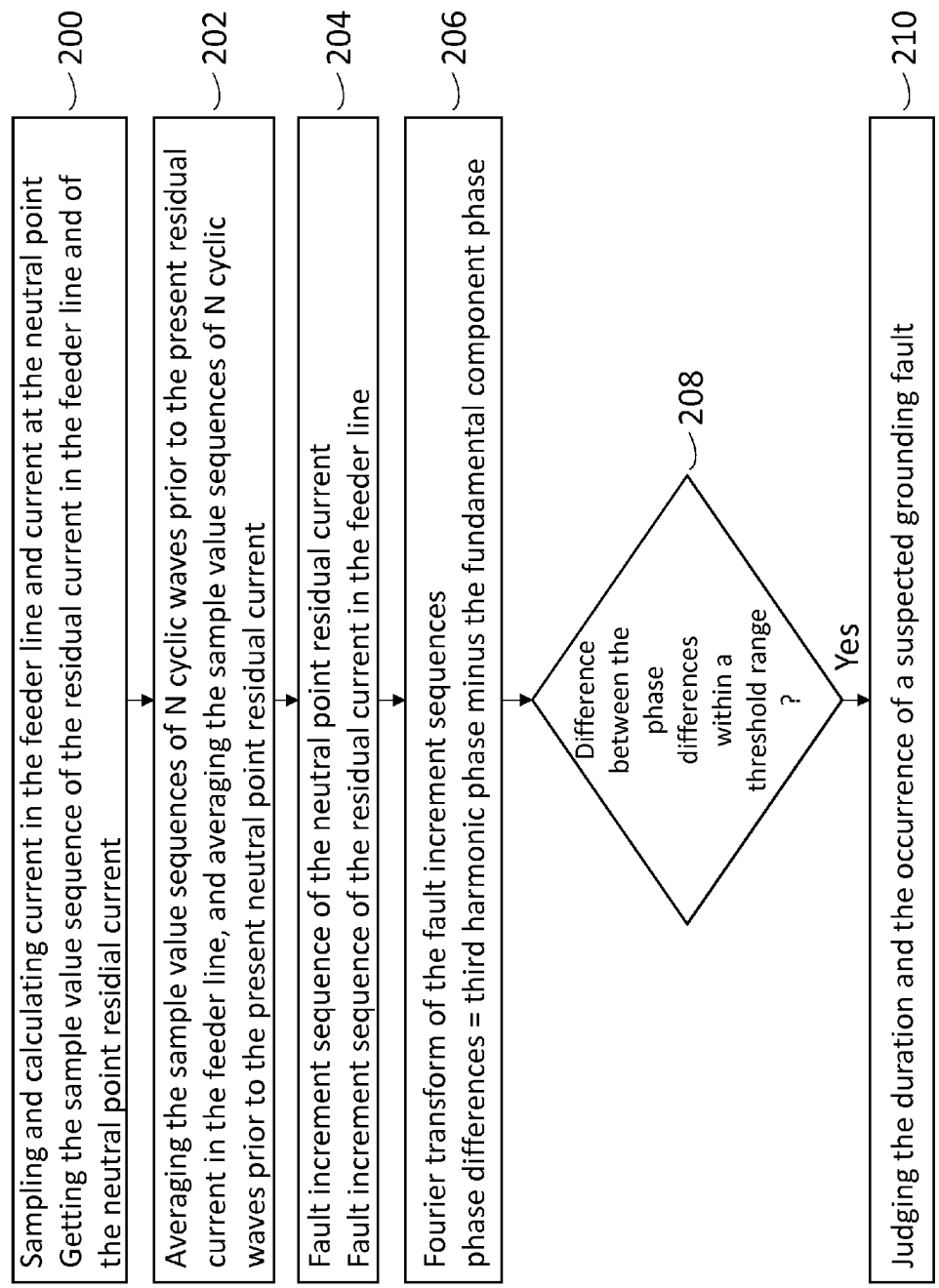
FIG. 2 illustrates a flow diagram of a method for detecting a grounding fault using a neutral point residual current according to an embodiment.

The detection objects of the invention are still the fundamental component and the harmonic component of the current. Similar to the traditional high impedance grounding detection method, it also focuses on the waveform distortion caused by the high resistance grounding fault, but it does not require the voltage signal as the comparison element. It just compares the harmonic component with the fundamental component, where the fundamental component is used as the reference element of direction comparison and the harmonic component is used as the element to be compared so as to achieve the above-mentioned harmonic analysis and direction distinguishing.

Thus, the present invention has overcome the disadvantages that the traditional over-current protection fails to distinguish the direction without the voltage signal, and succeeds in detecting the high impedance grounding fault, and is a practical and low-cost improvement and supplement to the traditional grounding fault detection based on the simple over-current theory.

PREFERRED EMBODIMENTS OF THE INVENTION

Embodiment 1

Embodiment 1 only needs to sample the residual current in the feeder line, without sampling the residual current at the neutral point. The working steps are as follows:

1) continuously sampling and calculating the current in the feeder line, and getting the sample value sequence of the residual current in the feeder line (achieved with the conventional detecting devices in the feeder line);

2) averaging the sample value sequences of six cyclic waves prior to the present residual current in the feeder line, to get the average sample value sequence;

3) getting the fault increment sequence by the present sample value sequence of one cyclic wave minus the average sample value sequence;

4) calculating the third harmonic amplitude A3 and angular velocity $\alpha 3$ and the fundamental amplitude A1 and angular velocity $\alpha 1$ of the fault increment sequence with Fourier transform, and calculating the phase difference of the third harmonic component relative to the fundamental component with the formula $\alpha 3 - 3 \times \alpha 1$ so as to get the phase difference of the residual current in the feeder line;

5) if the phase difference of the residual current in the feeder line is within the range of 180 degrees±60 degrees, then determining that said feeder line occurs the suspected grounding fault;

6) if the duration of the suspected grounding fault exceeds 2 seconds, then determining the grounding fault occurs; and if the duration exceeds 200 milliseconds, then determining the transient event occurs; and if the occurrence of the transient event exceeds 3 times in predetermined 30 seconds, then determining the intermittent grounding fault occurs.

In the steps, this embodiment uses three timers and one counter to achieve the above functions, wherein the first timer is a thirty-second global timer, the second timer is a two-second harmonic component fault timer, and the third timer is a two hundred-millisecond transient event timer. The timers time the above satisfaction condition state flags as follows:

If the setting time of 'satisfaction condition' flag is larger than the grounding fault time threshold;

Then the fault alarm is a grounding fault;

If the setting time of 'satisfaction condition' flag is larger than the transient event time threshold;

Then the method suspects the fault as a transient event and continues to detect; If the setting time of 'satisfaction condition' flag is smaller than the transient event time threshold;

Then the method identifies the fault as noise and makes no treatment;

If the transient event occurs three times when the global timer times out;

Then the fault alarm is an intermittent grounding fault.

Embodiment 2

The difference distinguishing embodiment 2 from embodiment 1 is to sample and use the residual current at the neutral point. Embodiment 2 determines the fault line according to the result of the phase difference of the residual current at the neutral point minus the phase difference of the residual current in the feeder line. This embodiment requires two conventional detecting devices, wherein one device directly detects the current flowing from the grounding point in the transformer substation into the earth, and the other detects the residual current in the feeder line of the same bus line in the transformer substation. Both detecting devices communicate to each other via the communication network.

The method of embodiment 2 is similar to the steps of embodiment 1, only adding the treatment of the residual current at the neutral point (treatment steps identical to those of residual current in the feeder line), and judging suspected grounding fault in step 5 according to different criterions by comparing the amplitude and phase differences of the three harmonic component relative to the fundamental component of the residual current in one feeder line and the amplitude and phase differences of the three harmonic component relative to the fundamental component of the residual current flowing from the neutral point into the earth. If the result of the phase difference of the residual current at the neutral point minus the phase difference of the residual current in the feeder line enters into the predetermined threshold range 2 (±60 degrees), then determines the feeder line occurs suspected grounding fault.

It is necessary for Embodiment 2 to detect the residual current at the neutral point and the residual current in the feeder line, so this embodiment involves the communication between the detecting devices. The implementation of embodiment 2 is more complex than that of embodiment 1, but in principle, it is not entirely dependent on the harmonic characteristics of the fault current and thus more reliable.

The invention claimed is:

1. A method for detecting single phase grounding fault in a feeder line of a power distribution network, wherein a fault detection device performs the steps of:
   1) continuously sampling and calculating the current in the feeder line, and getting the sample value sequence of the residual current in the feeder line;
   2) averaging the sample value sequences of N cyclic waves prior to the present residual current in the feeder line, to get the average sample value sequence, wherein N is a positive integer;
   3) getting a fault increment sequence by the present sample value sequence of one cyclic wave minus the average sample value sequence;
   4) calculating the third harmonic component amplitude and phase and the fundamental amplitude and phase of the fault increment sequence with Fourier transform, and getting the phase difference of the residual current in the feeder line by the third harmonic phase minus the fundamental component phase;
   5) if the phase difference of the residual current in the feeder line falls within a predetermined threshold range, determining that a suspected grounding fault occurs in said feeder line occurs; and
   6) judging the duration and the occurrence of the suspected grounding fault with three timers and a counter, to identify a grounding fault, an intermittent grounding fault, transient events or noise.

2. The method of claim 1, characterized in that, said predetermined threshold range is 180 degrees±60 degrees.

3. The method of claim 1, wherein
if the duration of the suspected grounding fault exceeds a fault time threshold, then a grounding fault is identified, and if the duration of the suspected grounding fault exceeds a transient event time threshold, then a transient event is identified, and if a plurality of transient events occur within a predetermined global reset time, then an intermittent grounding fault is identified.

4. A method for detecting single phase grounding fault in a feeder line of a power distribution network, wherein two fault detection devices configured to communicate to each other via a communication network perform the steps of:
1) continuously sampling and calculating the current in the feeder line with a first one of said two detection devices and the current at a neutral point with a second one of said two detection devices, and getting the sample value sequence of the residual current at the neutral point and the sample value sequence of the residual current in the feeder line;
2) averaging individually the sample value sequences of N cyclic waves prior to the present residual current at the neutral point and the present residual current in the feeder line respectively, to get the average sample value sequence of the residual current at the neutral point and the average sample value sequence of the residual current in the feeder line, wherein N is a positive integer;
3) getting a fault increment sequence of the residual current at the neutral point and a fault increment sequence of the residual current in the feeder line by the present sample value sequence of one cyclic wave of the residual current at the neutral point and the residual current in the feeder line minus the above average sample value sequence respectively;
4) calculating the third harmonic amplitude and phase and the fundamental amplitude and phase of the fault increment sequence of the residual current at the neutral point and the third harmonic amplitude and phase and the fundamental amplitude and phase of the fault increment sequence of the residual current in the feeder line with Fourier transform, and getting the phase difference of the residual current at the neutral point and the phase difference of the residual current in the feeder line by the third harmonic phase minus the fundamental component phase;
5) if the result of the phase difference of the residual current at the neutral point minus the phase difference of the residual current in the feeder line falls within a predetermined threshold range, determining that said feeder line occurs the suspected grounding fault; and
6) judging the duration and the occurrence of the suspected grounding fault with three timers and a counter, to identify a grounding fault, an intermittent grounding fault, transient events or noise.

5. The method of claim 4, characterized in that, said predetermined threshold range is ±60 degrees.

6. The method of claim 4, wherein
if the duration of the suspected grounding fault exceeds a fault time threshold, then the fault event is identified as a grounding fault, and if the duration of the suspected grounding fault exceeds a transient event time threshold, then the fault event is identified as a transient event, and if a plurality of transient events occur within a predetermined global reset time, then the fault event is identified as an intermittent grounding fault.

7. A single phase grounding fault detection device is configured to perform the steps of:
1) continuously sampling and calculating the current in a feeder line of a power distribution network, and getting the sample value sequence of the residual current in the feeder line;
2) averaging the sample value sequences of N cyclic waves prior to the present residual current in the feeder line, to get the average sample value sequence, wherein N is a positive integer;
3) getting a fault increment sequence by the present sample value sequence of one cyclic wave minus the average sample value sequence;
4) calculating the third harmonic component amplitude and phase and the fundamental amplitude and phase of the fault increment sequence with Fourier transform, and getting the phase difference of the residual current in the feeder line by the third harmonic phase minus the fundamental component phase;
5) if the phase difference of the residual current in the feeder line falls within a predetermined threshold range, determining that a suspected grounding fault occurs in said feeder line occurs;
6) judging the duration and the occurrence of the suspected grounding fault with three timers and a counter, to identify a grounding fault, an intermittent grounding fault, transient events or noise.

8. A single phase grounding fault detection system comprising two fault detection devices configured to perform the steps of:
1) continuously sampling and calculating the current in a feeder line of a power distribution system with a first one of said two detection devices and the current at a neutral point with a second one of said two detection devices, and getting the sample value sequence of the residual current at the neutral point and the sample value sequence of the residual current in the feeder line;
2) averaging individually the sample value sequences of N cyclic waves prior to the present residual current at the neutral point and the present residual current in the feeder line respectively, to get the average sample value sequence of the residual current at the neutral point and the average sample value sequence of the residual current in the feeder line, wherein N is a positive integer;
3) getting a fault increment sequence of the residual current at the neutral point and a fault increment sequence of the residual current in the feeder line by the present sample value sequence of one cyclic wave of the residual current at the neutral point and the residual current in the feeder line minus the above average sample value sequence respectively;
4) calculating the third harmonic amplitude and phase and the fundamental amplitude and phase of the fault increment sequence of the residual current at the neutral point and the third harmonic amplitude and phase and the fundamental amplitude and phase of the fault increment sequence of the residual current in the feeder line with Fourier transform, and getting the phase difference of the residual current at the neutral point and the phase difference of the residual current in the feeder line by the third harmonic phase minus the fundamental component phase;
5) if the result of the phase difference of the residual current at the neutral point minus the phase difference of the residual current in the feeder line falls within a predetermined threshold range, determining that said feeder line occurs the suspected grounding fault;

6) judging the duration and the occurrence of the suspected grounding fault with three timers and a counter, to identify a grounding fault, an intermittent grounding fault, transient events or noise.

\* \* \* \* \*